United States Patent
Kaufman-Osborn et al.

(10) Patent No.: US 10,192,752 B2
(45) Date of Patent: Jan. 29, 2019

(54) SELF-ASSEMBLED MONOLAYER BLOCKING WITH INTERMITTENT AIR-WATER EXPOSURE

(71) Applicant: Applied Materials, Inc., Santa Clara, CA (US)

(72) Inventors: Tobin Kaufman-Osborn, Sunnyvale, CA (US); Keith Tatseun Wong, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/446,816

(22) Filed: Mar. 1, 2017

(65) Prior Publication Data

US 2017/0256402 A1   Sep. 7, 2017

Related U.S. Application Data

(60) Provisional application No. 62/303,069, filed on Mar. 3, 2016.

(51) Int. Cl.
  *H01L 21/32* (2006.01)
  *H01L 21/3105* (2006.01)
(52) U.S. Cl.
  CPC .......... *H01L 21/32* (2013.01); *H01L 21/3105* (2013.01)
(58) Field of Classification Search
  CPC .............................. H01L 21/32; H01L 21/3105
  See application file for complete search history.

(56) References Cited

U.S. PATENT DOCUMENTS

| | | |
|---|---|---|
| 6,200,893 B1 | 3/2001 | Sneh |
| 6,391,785 B1 | 5/2002 | Satta et al. |
| 7,071,022 B2 | 7/2006 | Couillard et al. |
| 7,648,866 B2 | 1/2010 | Jung et al. |
| 7,775,508 B2 | 8/2010 | Choi et al. |
| 7,960,295 B2 | 6/2011 | Park |
| 9,112,003 B2 | 8/2015 | Haukka et al. |
| 9,502,289 B2 | 11/2016 | Haukka et al. |
| 2008/0026146 A1 | 1/2008 | Kobrin et al. |
| 2008/0044569 A1 | 2/2008 | Myo et al. |
| 2009/0057266 A1 | 3/2009 | Tuncel et al. |

(Continued)

FOREIGN PATENT DOCUMENTS

| | | |
|---|---|---|
| EP | 1202321 A2 | 5/2002 |
| KR | 10-2010-0107228 | 10/2010 |
| WO | 2011103062 A2 | 8/2011 |

OTHER PUBLICATIONS

Hashemi et al, Self Correcting Process for High Quality Patterning by Atomic Layer Deposition, American Chemical Society, Jul. 16, 2015.

(Continued)

*Primary Examiner* — William F Kraig
*Assistant Examiner* — Vicki B Booker
(74) *Attorney, Agent, or Firm* — Patterson + Sheridan, LLP (57) ABSTRACT

Implementations described herein generally relate to processes for the fabrication of semiconductor devices in which a self-assembled monolayer (SAM) is used to achieve selective area deposition. Methods described herein relate to alternating SAM molecule and hydroxyl moiety exposure operations which may be utilized to form SAM layers suitable for blocking deposition of subsequently deposited materials.

20 Claims, 3 Drawing Sheets

(56) References Cited

U.S. PATENT DOCUMENTS

| | | |
|---|---|---|
| 2011/0124187 A1 | 5/2011 | Afzali-Ardakani et al. |
| 2011/0198736 A1* | 8/2011 | Shero .................. B82Y 30/00 257/629 |
| 2012/0178650 A1 | 7/2012 | Carroll et al. |
| 2012/0238109 A1 | 9/2012 | Hattori et al. |
| 2013/0193108 A1 | 8/2013 | Zheng et al. |
| 2014/0357016 A1 | 12/2014 | Fuse et al. |
| 2014/0370718 A1 | 12/2014 | Chakrapani et al. |
| 2015/0090330 A1 | 4/2015 | Sewell et al. |
| 2015/0179500 A1 | 6/2015 | Boussie et al. |
| 2016/0056071 A1 | 2/2016 | Draeger et al. |
| 2016/0104648 A1 | 4/2016 | Park et al. |

OTHER PUBLICATIONS

Elina Farm, Selective-Area Atomic Layer Depositiion, University of Helsinki, Nov. 2011.

SE Kirkwood et al., Mechanism for femtosecond laser pulse patterning of SAM on gold coated substrate, IOP Publishing Ltd 2007 p. 428-430.

Ming Fang, et al., Area-Selective Atomic Layer Deposition: Conformal Coating, Subnanometer Thickness Control and Smart Positioning, ACS Nano 2015 Vo. 9. No. 9 pp. 8651-8654.

Non-final Office Action in U.S. Appl. No. 10/731,656 dated May 11, 2004.

European Office Action in application EP 00955875.0. dated May 8, 2004.

JW Klaus et al., Atomically controlled growth of tungsten and tungsten nitride using sequential surface reactions; Applied Surface Sciences 162-163 (2000) 479-491.

Mikko Ritala et al., Atomic layer epitaxy—a valuable tool for nanotechnology?; Nanotechnology 10 (1999) 19-24 printed in the UK.

Per Martensson et al., Atomic Layer Epitaxy of Copper, J. Electrochem. Soc., vol. 145, No. 8, Aug. 1998 The Electrochemical Society, Inc. pp. 2926-2931.

Shin Yokoyama, et al., Atomic-layer selective deposition of silicon nitride on hydrogen-terminated Si surfaces, Applied Surface Science 130-132 1998. 352-356.

Stephen M. Gates, Surface Chemistry in the Chemical Vapor Deposition of Electronic Materials, Chem. Rev. 1996, 96, pp. 1519-1532.

A. Jain et al., Control of selectivity during chemical vapor deposition of copper from copper (I) compounds via silicon dioxide surface modification, Applied Physics Letters 61, pp. 2662-2664 (1992) American Institute of Physics.

M. Leskela et al., ALD precursor chemistry: Evolution and future challenges, Article published online by EDP Sciences and available at http://dx.doi.org/10.1051/jp4:19998106.

Jae-Sik Min et al., Metal-organic atomic-layer deposition of titanium-silicon-nitride films. Applied Physics Letters vol. 75, No. 11 Sep. 13, 1999.

International Search Report and Written Opinion for International Application No. PCT/US2017/019982 dated Jun. 26, 2017.

\* cited by examiner

SELF-ASSEMBLED MONOLAYER BLOCKING WITH INTERMITTENT AIR-WATER EXPOSURE

CROSS-REFERENCE TO RELATED APPLICATIONS

This application claims benefit of U.S. Provisional Patent Application No. 62/303,069, filed Mar. 3, 2016, the entirety of which is herein incorporated by reference.

BACKGROUND

Field

Implementations described herein generally relate to processes for the fabrication of semiconductor devices in which a self-assembled monolayer is used to achieve selective area deposition.

Description of the Related Art

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities.

As circuit densities increase for next generation devices, the widths of interconnects, such as vias, trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other. As circuit densities and stacking increase, the ability to selectively deposit subsequent materials on previously deposited materials becomes increasingly desirable.

Self-assembled monolayers (SAMs) may be utilized as a masking material to improve subsequent material deposition selectivity. SAMs are generally surface chemistry dependent and can be formed preferentially on various materials. However, SAMs may exhibit pin holes or voids in as deposited layers which may not effectively prevent deposition of subsequent material layers. Another drawback of SAMs is that the time for deposition may be very long and not economically feasible in semiconductor manufacturing processes.

Thus, there is a need for improved methods for SAM formation.

SUMMARY

In one implementation, a method of processing a substrate is provided. The method includes exposing a substrate to a self-assembled monolayer ("SAM") molecule to achieve selective deposition of a SAM on a first material, where the substrate comprises an exposed first material and an exposed second material. The substrate may be exposed to a hydroxyl moiety and the exposing the substrate to a SAM molecule and the exposing the substrate to a hydroxyl moiety may be repeated in a time ratio of between about 1:1 and about 100:1, respectively. After performing the repeating, the substrate may be exposed to the SAM molecule, a third material may be selectively deposited on the exposed second material, and the SAM may be removed from the first material.

In another implementation, a method of processing a substrate is provided. The method includes exposing a substrate to a self-assembled monolayer ("SAM") molecule to achieve selective deposition of a SAM on a first material in a first processing chamber, where the substrate comprises an exposed first material and an exposed second material. The substrate may be transferred to a second processing chamber and the substrate may be exposed to a hydroxyl moiety formed from water vapor in the second processing chamber. The exposing the substrate to a SAM molecule in the first processing chamber and the exposing the substrate to a hydroxyl moiety in the second processing chamber may be repeated in a time ratio of between about 1:1 and about 100:1, respectively. After performing the repeating, the substrate may be exposed to the SAM molecule in the first processing chamber, a third material may be selectively deposited on the exposed second material, and the SAM may be removed from the first material.

In yet another implementation, a method of processing a substrate is provided. The method includes exposing a substrate to a self-assembled monolayer ("SAM") molecule to achieve selective deposition of a SAM on a first material in a processing chamber, where the substrate comprises an exposed first material and an exposed second material. The substrate may be transferred to an ambient air environment and exposed to a hydroxyl moiety formed from ambient air in the ambient air environment. The exposing the substrate to a SAM molecule in the processing chamber and the exposing the substrate to a hydroxyl moiety in the ambient air environment may be repeated in a time ratio between about 1:1 and about 100:1, respectively. After performing the repeating, the substrate may be exposed to the SAM molecule in the processing chamber, a third material may be selectively deposited on the exposed second material, and the SAM may be removed from the first material.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes processes for the fabrication of semiconductor devices in which a self-assembled monolayer is used to achieve selective deposition. Certain details are set forth in the following description and in FIG. 1 and FIGS. 2A-2B, to provide a thorough understanding of various implementations of the disclosure. Other details describing structures and systems often associated with semiconductor devices and self-assembled monolayers are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, and features without departing from the spirit or scope of the present disclosure. In addition, further implementations of the disclosure can be practiced without several of the details described below.

As utilized herein, "self-assembled monolayer" ("SAM") generally refers to a layer of molecules that are attached (e.g., by a chemical bond) to a surface and that have adopted a preferred orientation with respect to that surface and even with respect to each other. The SAM typically includes an organized layer of amphiphilic molecules in which one end of the molecule, the "head group" shows a specific, reversible affinity for a substrate. Selection of the head group will depend on the application of the SAM, with the type of SAM compounds based on the substrate utilized. Generally, the head group is connected to an alkyl chain or fluorinated alkyl chain in which a tail or "terminal end" can be functionalized, for example, to vary wetting and interfacial properties. The molecules that form the SAM will selectively attach to one material over another material (e.g., metal vs. dielectric) and if of sufficient density, can successfully operation subsequent deposition allowing for selective deposition on materials not coated with the SAM.

Existing technology generally utilizes at least six hours for SAM deposition in order to form a SAM film dense enough to operation metal deposition. Existing technology generally utilizes at least 48 hours for SAM film deposition in order to operation metal oxide. Current vapor deposition systems deliver the SAM molecule at very low pressures (e.g., 2 mTorr) using only the vapor pressure of a heated SAM molecule solution to expose the chemistry to the substrate. This low vapor pressure results in low concentration in the gas phase and requires 48 hours for dense formation. Thus, it takes a significant time to form dense high quality SAM films without pinholes. If the formation time for the SAM is too short, the SAM contains many pinholes through which deposition can occur.

In some implementations described herein, methods for increasing the rate of formation of dense SAM films with reduced pinhole formation are provided. In some implementations described herein, methods of treating a formed SAM film to operation formed pinholes are also provided. Both allow for the formation of SAM films with reduced pinholes.

Figure 1:
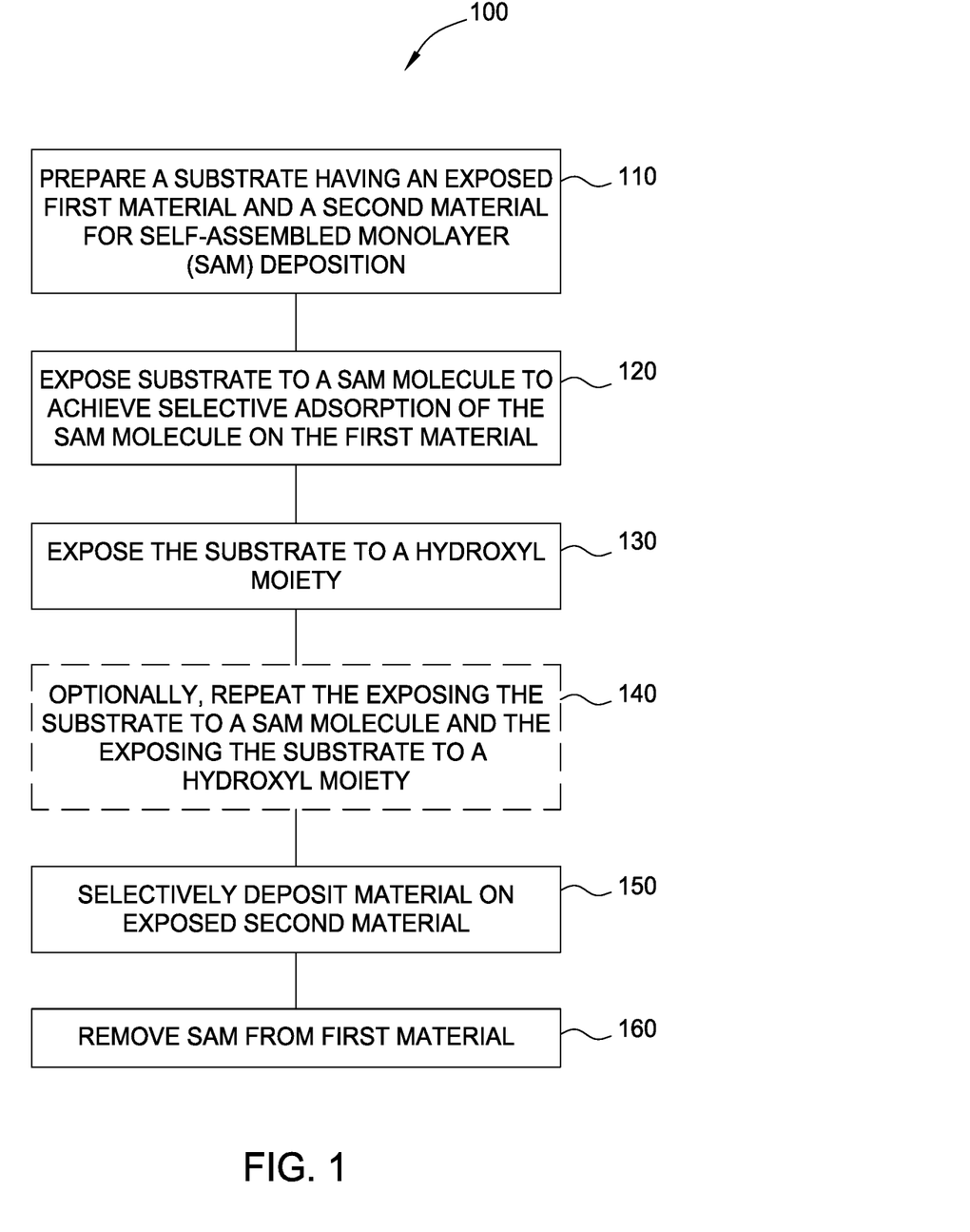
FIG. 1 illustrates a flow diagram depicting a method of selective deposition with SAM materials according to implementations described herein.

FIG. 1 is a flow chart depicting a method 100 of selective deposition with SAM films according to implementations described herein. The method 100 is performed upon a workpiece during the fabrication process. The method 100 may be used to form a structure as depicted in the sequence of fabrication stages depicted in FIGS. 2A-2D which are discussed in greater detail below. FIGS. 2A-2D depict cross-sectional schematic views of the fabrication steps of a device structure formed on a substrate. Although FIG. 1 is described with reference to a specific structure, it should be understood that reference to the specific structure is only illustrative and the processes described in FIG. 1 are applicable to any process where it is desirable to selectively deposit a film on a substrate containing multiple materials where reduced pinhole formation is desirable.

At operation 110, a substrate having at least an exposed first material and an exposed second material is prepared for SAM deposition. The substrate may be similar to substrate 210 depicted in FIGS. 2A-2D. In one embodiment, the substrate 210 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, and combinations thereof. The substrate 210 may have various dimensions, such as 200 mm, 300 mm, 450 mm or other diameters for round substrates. The substrate 210 may also be any polygonal, square, rectangular, curved or otherwise non-circular workpiece, such as a polygonal glass substrate used in the fabrication of flat panel displays. Unless otherwise noted, implementations and examples described herein are conducted on substrates with a 200 mm diameter, a 300 mm diameter, or a 450 mm diameter substrate.

Figure 2A:
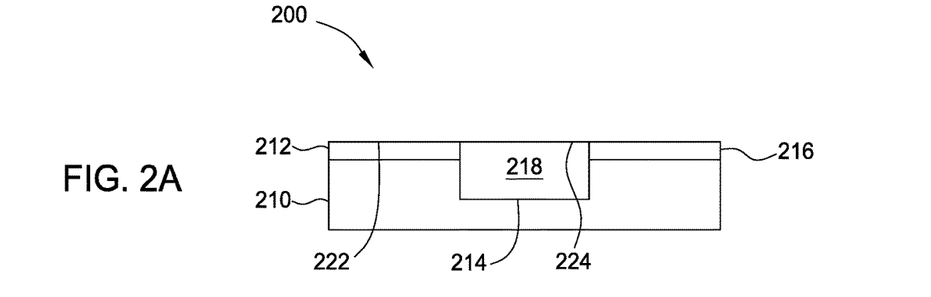
FIGS. 2A-2D illustrate schematic, cross-sectional view of a workpiece processed according to implementations described herein.

The substrate 210 may include a feature 212 formed from a first material 216 (e.g., a dielectric material). The feature 212 may include, for example, trenches, vias, holes, openings, lines, the like, and combinations thereof. The feature 212 has an opening 214 that is filled with a second material 218 (e.g., a conductive material) disposed on the substrate 210 as shown in FIG. 2A. It should be understood that the first material 216 and the second material 218 may both be dielectric materials. For example, the first material 216 may be a silicon oxide layer and the second material 218 may be a silicon nitride layer.

In preparation for deposition of a SAM film, the substrate 210 may be exposed to an optional pre-clean process prior to the SAM film formation process of subsequent operations. The pre-clean process may be any pre-clean process capable of removing native oxides, contaminants, or both from the exposed surfaces. The pre-clean process may be a dry chemical clean process, a wet chemical clean process, or both. The pre-clean process may be a remote plasma clean or an in-situ plasma clean that is adapted to perform a dry etch process. One exemplary dry cleaning process is the SICONI™ Pre-clean process available from Applied Materials, Inc., Santa Clara, Calif., which removes native oxide through a low-temperature, two-part dry chemical clean process using $NF_3$ and $NH_3$. It is contemplated that other suitably configured cleaning processes from other manufacturers may also be advantageously implemented according to the implementations described herein.

Figure 2B:
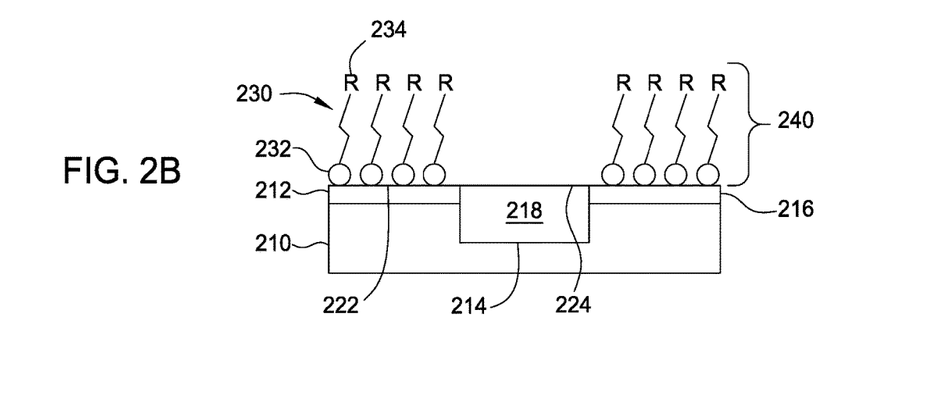

At operation 120, the substrate 210 is exposed to a SAM precursor to achieve selective adsorption of the SAM precursor on a surface 222 of the first material 216 with minimal to no adsorption on the surface 224 of the second material 218 as shown in FIG. 2B. Depending upon the materials used and the SAM precursors used, the SAM precursor may be a solution based precursor or a gaseous precursor. The SAM precursor may comprise one or more SAM molecules 230, precursors that form the SAM molecules 230, or both. The adsorbed SAM molecules 230 form the SAM 240.

The SAM 240 comprises an organized layer of the SAM molecules 230, which may be amphiphilic, in which one end of the molecule, a head group 232 shows a specific, reversible affinity for the first material 216 of the feature 212. The head group 232 is typically connected to an alkyl chain in which a terminal end "R" 234 can be functionalized. The SAM 240 is formed by chemisorption of the head group 232 onto the first material 216 of the feature 212, followed by two-dimensional organization of the hydrophobic tail groups.

Examples of suitable SAM molecules 230 which may be utilized in accordance with the implementations described herein include the materials described hereinafter, including combinations, mixtures, and grafts thereof, in addition to other SAM molecules having characteristics suitable for blocking deposition of subsequently deposited materials in a semiconductor fabrication process. In one implementation, the SAM molecules 230 may be carboxylic acid materials, such as methylcarboxylic acids, ethylcarboxylic acids, propylcarboxylic acids, butylcarboxylic acids, pentylcarboxylic acids, hexylcarboxylic acids, heptylcarboxylic acids, octylcarboxylic acids, nonylcarboxylic acids, decylcarboxylic acids, undecylcarboxylic acids, dodecylcarboxylic acids, tridecylcarboxylic acids, tetradecylcarboxylic acids, pentadecylcarboxylic acids, hexadecylcarboxylic acids, heptadecylcarboxylic acids, octadecylcarboxylic acids, and nonadecylcarboxylic acids.

In one implementation, the SAM molecules 230 may be phosphonic acid materials, such as methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecyphosphonic acid, pentadecylphosphonic acid, hexadecylphosphonic acid, heptadecylphosphonic acid, octadecylphosphonic acid, and nonadecylphosphonic acid.

In another implementation, the SAM molecules 230 may be thiol materials, such as methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, and nonadecanethiol.

In another implementation, the SAM molecules 230 may be silylamine materials, such as tris(dimethylamino)methylsilane, tris(dimethylamino)ethylsilane, tris(dimethylamino)propylsilane, tris(dimethylamino)butylsilane, tris(dimethylamino)pentylsilane, tris(dimethylamino)hexylsilane, tris(dimethylamino)heptylsilane, tris(dimethylamino)octylsilane, tris(dimethylamino)nonylsilane, tris(dimethylamino)decylsilane, tris(dimethylamino)undecylsilane, tris(dimethylamino)dodecylsilane, tris(dimethylamino)tridecylsilane, tris(dimethylamino)tetradecylsilane, tris(dimethylamino)pentadecylsilane, tris(dimethylamino)hexadecylsilane, tris(dimethylamino)heptadecylsilane, tris(dimethylamino)octadecylsilane, and tris(dimethylamino)nonadecylsilane.

In another implementation, the SAM molecules 230 may be chlorosilane materials, such as methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, and nonadecyltrichlorosilane.

In another embodiment, the SAM molecules 230 may be oxysilane materials, such as methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltriethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltriethoxysilane, heptadecyltrimethoxysilane, heptadecyltriethoxysilane, octadecyltrimethoxylsilane octadecyltriethoxysilane, nonadecyltrimethoxysilane, and nonadecyltriethoxysilane.

In another implementation, the SAM molecules 230 may have a fluorinated R group, such as (1,1,2,2-perfluorodecyl)trichlorosilane, trichloro(1,1,2,2-perfluorooctyl)silane, (trideca-fluoro-1,1,2,2-tetrahydrooctyl)trichlorosilane, (tridecafluoro-1,1,2,2-tetrahydro-octyl)triethoxysilane, (tridecafluoro-1,1,2,2-tetrahydrooctyl)methyldichlorosilane, (tridecafluoro-1,1,2,2-tetrahydrooctyl)dimethylchlorosilane, and (heptadecafluoro-1,1,2,2-tetrahydrodecyl)trichlorosilane, among others.

SAM adsorption can occur from solution by immersion of the substrate 210 into a dilute solution containing the SAM molecules 230. In one implementation, the SAM 240 is deposited via spin-coating from a solution. SAM adsorption can also occur from vapor deposition by exposing the substrate 210 to a gaseous precursor. The adsorbed molecules initially form a disordered mass of molecules and then begin to form crystalline or semi-crystalline structures on the first material 216 of the feature 212. The thickness of the SAM 240 can be adjusted by adjusting the carbon chain length of the alkyl chain of the SAM molecule 230. Generally, the SAM 240 may be formed on the surface that has chemical reaction capability with the SAM molecules 230.

In one implementation, the SAM adsorption may be a vapor phase deposition process. In this implementation, SAM molecules may be vaporized in an ampoule maintained at a temperature between about 25° C. and about 300° C., such as between about 125° C. and about 200° C. The substrate 210 may be maintained at a temperature of between about 25° C. and about 400° C., such as between about 50° C. and about 200° C., for example, between about 100° C. and about 175° C. A pressure of the substrate processing environment, such as the processing volume of a processing chamber, may be maintained at a pressure of between about 1 mT and about 1520 T, such as between about 5 T and about 600 T. A carrier gas may be utilized to facilitate delivery of vapor phase SAM molecules and the carrier gas, depending on the volume of the processing chamber, may be delivered at a flow rate of between about 25 sccm and about 3000 sccm, such as between about 50 sccm and about 1000 sccm. Suitable carrier gases include gases, such as noble gases or the like, that are generally inert under SAM adsorption conditions that facilitate delivery of the SAM molecules to the substrate surfaces. The SAM molecules may be exposed to the substrate 210 in operation 130 for an amount of time between about 1 second and about 48 hours, for example, between about 1 minute and about 120 minutes.

In the implementations depicted in FIG. 2B, the SAM precursor utilized to form the SAM 240 is selected to chemically react with the surface 222 of the feature 212, (e.g., a silicon oxide material), rather than the surface 224 of the second material 218 (e.g., a conductive material). By doing so, the SAM 240 may be predominantly formed on the feature 212 on the substrate 210, leaving the surface 224 of the second material 218 free of SAM 240.

At operation 130, the substrate 210 may be exposed to a hydroxyl moiety. The hydroxyl moiety may be a material which has or facilitates formation of an —OH functional group on the surface 222 or the SAM molecule 230. While not intending to be bound by theory, it is believed that hydroxylation of the surface 222 and/or reactive sites of the SAM molecules 230 may facilitate formation of a densely packed SAM 240 which exhibits reduced or eliminated pin holes. It is believed that hydroxylation may reduce the prevalence of reactive site blocking ligands which cause steric hindrance. As a result, the SAM molecules 230 may be able to more easily adsorb on the surface 222 in a closely packed orientation. For example, it is believed that hydroxylation may promote adsorption of SAM molecules on the surface 222 preferentially to polymerization of SAM ligands already present on the surface 222.

In an alternate implementation, the substrate 210 may be exposed to the hydroxyl moiety at operation 120 and subsequently exposed to a SAM precursor at operation 130. In another similar implementation, the substrate 210 may be exposed to the hydroxyl moiety in operation 120 simultaneously with exposure of the substrate 210 to SAM precursor in operation 130.

In other implementations, SAM precursors and hydroxyl moieties are pulsed in an alternating fashion. Moreover, SAM precursors and hydroxyl moieties may be co-flowed together in a pulsed or continuous manner. In one implementation, SAM precursors and hydroxyl moieties soak the substrate 210 in alternating vapor exposure operations. For example, the SAM precursor is delivered to the chamber and the chamber is pressurized for a period of time before the SAM precursor is evacuated from the chamber. Subsequently, the hydroxyl moiety is delivered to the chamber and the chamber is pressurized for a period of time before the hydroxyl moiety is evacuated from the chamber. In these implementations, the substrate 210 is soaked in the SAM/hydroxyl in an alternating fashion. In another implementation, the SAM precursor and the hydroxyl moiety are simultaneously delivered to the chamber and the chamber is pressurized to allow the substrate 210 to soak in the SAM/hydroxyl environment for a period of time prior to evacuating the SAM/hydroxyl from the chamber. In yet another implementation, the substrate 210 is exposed to the SAM precursor and subsequently exposed to ambient air.

The pulsing and soaking implementations described above may be performed for various durations depending upon the desired implementation. It is contemplated that the duration of the pulses and/or soaks can change depending upon the progression of the method. For example, the pulse/soak durations at the beginning of the method 100 may be longer relative to the pulse/soak durations near the end of the method 100. It is believed that any combination of SAM precursor/hydroxyl moiety exposure duration and any soak/pulse duration may be utilized together to obtain SAM deposition with reduced or eliminated pinholes.

Examples of suitable hydroxyl moiety precursors include ambient air, water solution or vapor, hydrogen peroxide solution or vapor, organic alcohol solutions or vapors, such as methanol, isopropanol, ethanol, and diols, among others. Hydrogen gas and oxygen gas may also be utilized in combination to form hydroxyl moieties. It is contemplated that other non-hydroxyl moiety precursors may also be utilized in accordance with the implementations described herein. Non-hydroxyl moiety precursors may include nitrogen gas, (di)isocyanates, hydrogen sulfide, and ammonia, among others.

Exposure of the substrate 210 to a hydroxyl moiety in operation 130 may be performed sequentially after exposure of the substrate 210 to SAM molecules in operation 120. Alternatively, exposure of the substrate 210 to a hydroxyl moiety in operation 130 may be performed simultaneously with exposure of the substrate 210 to SAM molecules in operation 120.

In one implementation, the substrate 210 may be exposed to ambient air in operation 130 subsequent to exposure of the substrate 210 to SAM molecules in operation 120. In this implementation, during operation 130, the temperature of the substrate 210 may be maintained at a temperature of between about 25° C. and about 400° C. in a processing environment having a pressure of between about 1 mT and about 1520 T. The substrate 210 may be exposed to ambient air for an amount of time between about 30 seconds and about 600 seconds. In this implementation, the ambient air exposure may be performed in a vacuum chamber pumped up to atmospheric pressure or the substrate 210 may be removed from a vacuum processing chamber environment and maintained in ambient air at approximately atmospheric pressure.

In another implementation, the substrate 210 may be exposed to liquid water or water vapor in operation 130 subsequent to exposure of the substrate 210 to SAM molecules in operation 120. In this implementation, the substrate 210 may be exposed to liquid water or water vapor for an amount of time between about 1 seconds and about 600 seconds. In liquid water exposure implementations, a suitable amount of water, such as between about 25 ml and about 50 ml (for a 300 mm substrate), may be provided to the processing environment to facilitate. The water may be removed from the processing environment after adequate time for hydroxylation to occur.

In water vapor implementations, a temperature of the substrate 210 may be maintained between about 20° C. and about 400° C. and a pressure of the processing environment may be maintained between about 2 T and about 1520 T.

The exposure to a hydroxyl moiety of operation 130 may be performed in the same processing environment as the exposure of the substrate 210 to the SAM molecule of operation 120. Alternatively, the exposure to a hydroxyl moiety may be performed in a processing environment different than the processing environment utilized to expose the substrate 210 to the SAM molecule. For example, a cluster tool may be utilized and operation 120 may be performed in a first processing chamber and operation 130 may be performed in a second processing chamber. The substrate 210 may be transferred between the first and second processing chambers under vacuum in certain implementations, or between the first and second processing chambers at approximately atmospheric pressures, depending upon desired processing conditions (i.e. water vapor or ambient air exposure).

At operation 140, operation 120 and operation 130 may be optionally repeated in a sequential or simultaneous manner. For example, operation 120 and operation 130 may be repeated between about 1 time and about 500 times. In one implementation, operation 120 may be performed a first time, operation 130 may be performed a first time, and operation 120 may be performed a second time. In this implementation, the operations may be performed sequentially. In another implementation, operation 120 and operation 130 may be repeated between about 5 times and about 50 times. In this implementation, operation 140 may be followed by an additional operation 120 such that exposure of the substrate 210 to the SAM molecule 230 is performed immediately prior to operation 150.

In certain implementations where operation 120 and operation 130 are repeated in a sequential manner, a time ratio of operation 120 to operation 130 may be between about 1:1 operation 120:operation 130 and about 100:1 operation 120:operation 130, for example, about 10:1 operation 120:operation 130. In this implementation, operation 120 may be performed for an amount of time between about 1 minute and about 10 minutes and operation 130 may be performed for an amount of time between about 1 minute and about 10 minutes. Operation 140 may be followed by an additional operation 120 performed for an amount of time substantially equal to the amount of time operation 120 was performed during each of the cyclic exposure process of operation 140, however, it is contemplated that a greater or lesser amount of time for the additional operation 120 may be advantageously implemented. For example, in the implementation described above, the additional operation 120 may be performed for an amount of time between about 1 minute and about 10 minutes, such as about 5 minutes.

It is believed that cyclic SAM molecule and hydroxyl moiety exposure may provide for SAMs having improved material blocking properties (i.e. reduced pin holes). For example, SAMs processed utilizing cyclic hydroxyl moiety exposure exhibited an increased water contact angle (i.e. 110°) relative to SAMs not processed utilizing cyclic hydroxyl moiety exposure (water contact angle of approximately 100°) which is indicative of improved blocking performance.

Figure 2C:
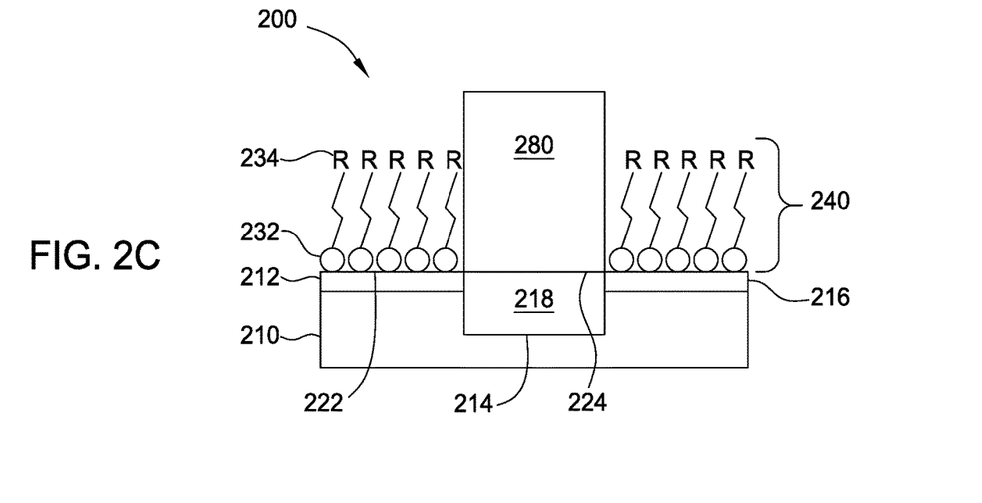
Figure 2D:
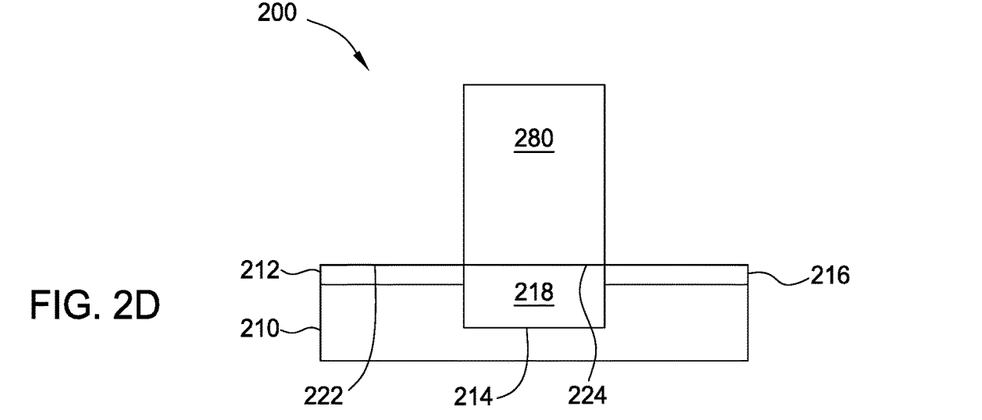

At operation 150, a deposition process, which is a process highly sensitive to surface conditions, having selected precursors, is then performed to form a structure 260 selectively on the surface 224 of the second material 218, as illustrated in FIG. 2C. Structure 280 may be formed by various techniques including, for example, chemical vapor deposition (CVD), such as plasma-enhanced CVD (PE-CVD), pulsed-CVD, low pressure CVD (LPCVD), epitaxial growth, physical vapor deposition (PVD) such as sputtering or evaporation, atomic layer deposition (ALD), electroplating, other techniques, or combinations thereof. The material selected to be deposited may be influenced by the surface properties of the substrate 210. The thickness of the structure 280 will vary depending on the materials and particular devices being formed. The SAM 240 prevents deposition of the material on the surface 222 of the first material 216. In this manner, a selective deposition process may selectively deposit different materials at different locations on the substrate.

In one implementation, the deposition process is an ALD process. As the ALD process is sensitive to surface conditions, ALD is suitable for a selective deposition of materials on specific regions of the substrate. The ALD process is a CVD process with self-terminating/limiting growth. The ALD process yields a thickness of only a few angstroms or in a monolayer level. The ALD process is controlled by distribution of a chemical reaction into two separate half reactions which are repeated in cycles. The thickness of the material formed by the ALD process depends on the number of the reaction cycles. The first reaction provides a first atomic layer of molecular layer being absorbed on the substrate and the second reaction provides a second atomic layer of molecular layer being absorbed on the first atomic layer. As such, the ordered structure of the material acts as a template for the growth of the material layer.

Following the deposition process of operation 150, at operation 160, the SAM 240 is removed from the surface 222 of the first material 212. The SAM 240 may be removed by any process which does not adversely affect structure 280 or the surface 222 of the first material 216. The process for removing the SAM 240 is the result of the selection of the terminal and head groups of the SAM molecules 230. The SAM 240 may be removed by a wet etching process, a dry etching process, a high temperature anneal process (e.g., greater than 300° C.) to release the SAM from the surface 222 of the first material 216. Subsequent to operation 160, additional processing operations may be performed to manufacture semiconductor and other device features.

While the foregoing is directed to implementations of the present disclosure, other and further implementations of the disclosure may be devised without departing from the basic scope thereof, and the scope thereof is determined by the claims that follow.

What is claimed is:

1. A method of processing a substrate, comprising:
    exposing a substrate to a self-assembled monolayer ("SAM") molecule for a first period of time from 30 seconds to 600 seconds to achieve selective deposition of a SAM on a first material, wherein the substrate comprises an exposed first material and an exposed second material;
    exposing the substrate to a hydroxyl moiety for a second period of time from 1 second to 600 seconds;
    repeating the exposing the substrate to a SAM molecule and the exposing the substrate to a hydroxyl moiety in a time ratio of the first period of time to the second period of time from between about 1:1 and about 100:1, respectively;
    after performing the repeating, exposing the substrate to the SAM molecule;
    selectively depositing a third material on the exposed second material; and
    removing the SAM from the first material.

2. The method of claim 1, wherein a hydroxyl moiety precursor is selected from the group consisting of ambient air, water solution, water vapor, hydrogen peroxide solution, hydrogen peroxide vapor, organic alcohol solutions, and organic alcohol vapors.

3. The method of claim 2, wherein the hydroxyl moiety precursor is selected from the group consisting of water solution, water vapor, and ambient air.

4. The method of claim 1, wherein a hydroxyl moiety precursor is water vapor.

5. The method of claim 1, wherein a hydroxyl moiety precursor is ambient air.

6. The method of claim 1, wherein the time ratio of the exposing the substrate to a SAM molecule and the exposing the substrate to a hydroxyl moiety is about 10:1.

7. The method of claim 1, wherein the exposing the substrate to the SAM molecule performed after the repeating is performed for an amount of time substantially equal to the amount of time the exposing the substrate to a SAM molecule was performed during one cycle of the repeating.

8. The method of claim 1, wherein the SAM molecule is selected from the group consisting of carboxylic acid materials, phosphonic acid materials, thiol materials, silylamine materials, chlorosilane materials, oxysilane materials, and combinations thereof.

9. The method of claim 8, wherein the phosphonic acid materials are selected from the group consisting of methylphosphonic acid, ethylphosphonic acid, propylphosphonic acid, butylphosphonic acid, pentylphosphonic acid, hexylphosphonic acid, heptylphosphonic acid, octylphosphonic acid, nonylphosphonic acid, decylphosphonic acid, undecylphosphonic acid, dodecylphosphonic acid, tridecylphosphonic acid, tetradecyphosphonic acid, pentadecylphosphonic acid, hexadecylphosphonic acid, heptadecylphosphonic acid, octadecylphosphonic acid, nonadecylphosphonic acid, and combinations thereof.

10. The method of claim 8, wherein the thiol materials are selected from the group consisting of methanethiol, ethanethiol, propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, nonadecanethiol, and combinations thereof.

11. The method of claim 8, wherein the silylamine materials are selected from the group consisting of tris(dimethylamino)methylsilane, tris(dimethylamino)ethylsilane, tris(dimethylamino)propylsilane, tris(dimethylamino)butylsilane, tris(dimethylamino)pentylsilane, tris(dimethylamino)hexylsilane, tris(dimethylamino)heptylsilane, tris(dimethylamino)octylsilane, tris(dimethylamino)nonylsilane, tris(dimethylamino)decylsilane, tris(dimethylamino)undecylsilane, tris(dimethylamino)dodecylsilane, tris(dimethylamino)tridecylsilane, tris(dimethylamino)tetradecylsilane, tris(dimethylamino)pentadecylsilane, tris(dimethylamino)hexadecylsilane, tris(dimethylamino)heptadecylsilane, tris(dimethylamino)octadecylsilane, tris(dimethylamino)nonadecylsilane and combinations thereof.

12. The method of claim 8, wherein the chlorosilane materials are selected from the group consisting of methyltrichlorosilane, ethyltrichlorosilane, propyltrichlorosilane, butyltrichlorosilane, pentyltrichlorosilane, hexyltrichlorosilane, heptyltrichlorosilane, octyltrichlorosilane, nonyltrichlorosilane, decyltrichlorosilane, undecyltrichlorosilane, dodecyltrichlorosilane, tridecyltrichlorosilane, tetradecyltrichlorosilane, pentadecyltrichlorosilane, hexadecyltrichlorosilane, heptadecyltrichlorosilane, octadecyltrichlorosilane, nonadecyltrichlorosilane, and combinations thereof.

13. The method of claim 8, wherein the oxysilane materials are selected from the group consisting of methyltrimethoxysilane, methyltriethoxysilane, ethyltrimethoxysilane, ethyltriethoxysilane, propyltrimethoxysilane, propyltriethoxysilane, butyltrimethoxysilane, butyltriethoxysilane, pentyltrimethoxysilane, pentyltriethoxysilane, hexyltrimethoxysilane, hexyltriethoxysilane, heptyltrimethoxysilane, heptyltriethoxysilane, octyltrimethoxysilane, octyltriethoxysilane, nonyltrimethoxysilane, nonyltriethoxysilane, decyltrimethoxysilane, decyltriethoxysilane, undecyltrimethoxysilane, undecyltriethoxysilane, dodecyltrimethoxysilane, dodecyltriethoxysilane, tridecyltrimethoxysilane, tridecyltriethoxysilane, tetradecyltrimethoxysilane, tetradecyltriethoxysilane, pentadecyltrimethoxysilane, pentadecyltriethoxysilane, hexadecyltrimethoxysilane, hexadecyltriethoxysilane, heptadecyltrimethoxysilane, heptadecyltriethoxysilane, octadecyltrimethoxylsilane octadecyltriethoxysilane, nonadecyltrimethoxysilane, nonadecyltriethoxysilane, and combinations thereof.

14. A method of processing a substrate, comprising:
exposing a substrate to a self-assembled monolayer ("SAM") molecule for a first period of time to achieve selective deposition of a SAM on a first material in a first processing chamber, wherein the substrate comprises an exposed first material and an exposed second material;
transferring the substrate to a second processing chamber;
exposing the substrate to a hydroxyl moiety formed from water vapor in the second processing chamber for a second period of time;
repeating the exposing the substrate to a SAM molecule in the first processing chamber and the exposing the substrate to the hydroxyl moiety formed from water vapor in the second processing chamber in a time ratio of the first period of time to the second period of time between about 1:1 and about 100:1, respectively, and wherein a first repetition occurs for a first total time and a subsequent repetition occurs for a second total time that is less than the first total time;
after performing the repeating, exposing the substrate to the SAM molecule in the first processing chamber;
selectively depositing a third material on the exposed second material; and
removing the SAM from the first material.

15. The method of claim 14, wherein the transferring the substrate is performed under vacuum.

16. The method of claim 14, wherein the exposing the substrate to the hydroxyl moiety formed from water vapor is performed at a temperature of between about 25° C. and about 300° C., at a pressure between about 1 T and about 600 T, and for an amount of time between about 1 second and about 600 seconds.

17. The method of claim 14, wherein the time ratio of the exposing the substrate to a SAM molecule and the exposing the substrate to the hydroxyl moiety formed from water vapor is between about 1:1 and about 10:1.

18. A method of processing a substrate, comprising:
exposing a substrate to a self-assembled monolayer ("SAM") molecule for a first period of time to achieve selective deposition of a SAM on a first material in a processing chamber, wherein the substrate comprises an exposed first material and an exposed second material;
transferring the substrate to an ambient air environment;
exposing the substrate to a hydroxyl moiety formed from ambient air in the ambient air environment for a second period of time;
repeating the exposing the substrate to a SAM molecule in the processing chamber and the exposing the substrate to a hydroxyl moiety in the ambient air environment in a time ratio of the first period of time to the second period of time between about 1:1 and about 100:1, respectively;
after performing the repeating, exposing the substrate to the SAM molecule in the processing chamber;
selectively depositing a third material on the exposed second material; and
removing the SAM from the first material.

19. The method of claim 18, wherein the exposing the substrate to a hydroxyl moiety formed from ambient air is performed at temperature of between about 25° C. and about 400° C., at a pressure of between about 1 mT and about 1520 T, and for an amount of time between about 30 second and about 600 seconds.

20. The method of claim 18, wherein the time ratio of the exposing the substrate to a SAM molecule and the exposing the substrate to a hydroxyl moiety formed from ambient air is between about 1:1 and about 10:1.

* * * * *

UNITED STATES PATENT AND TRADEMARK OFFICE
CERTIFICATE OF CORRECTION

PATENT NO. : 10,192,752 B2
APPLICATION NO. : 15/446816
DATED : January 29, 2019
INVENTOR(S) : Tobin Kaufman-Osborn et al.

It is certified that error appears in the above-identified patent and that said Letters Patent is hereby corrected as shown below:

In the Specification

In Column 5, Lines 28-29, delete "tetradecyphosphonic" and insert -- tetradecylphosphonic --, therefor.

In the Claims

In Column 11, Line 4, in Claim 9, delete "tetradecyphosphonic" and insert -- tetradecylphosphonic --, therefor.

Signed and Sealed this
Second Day of April, 2019

Andrei Iancu
*Director of the United States Patent and Trademark Office*